(12) United States Patent
Kim

(10) Patent No.: US 12,484,384 B2
(45) Date of Patent: Nov. 25, 2025

(54) ELECTROLUMINESCENT DISPLAY DEVICE AND METHOD OF MANUFACTURING THE SAME

(71) Applicant: LG Display Co., Ltd., Seoul (KR)

(72) Inventor: Kang-Hyun Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 498 days.

(21) Appl. No.: 17/977,992

(22) Filed: Oct. 31, 2022

(65) Prior Publication Data
US 2023/0180531 A1    Jun. 8, 2023

(30) Foreign Application Priority Data
Dec. 8, 2021    (KR) ........................ 10-2021-0174585

(51) Int. Cl.
| | | |
|---|---|---|
| H01L 27/32 | (2006.01) | |
| H01L 51/50 | (2006.01) | |
| H01L 51/52 | (2006.01) | |
| H01L 51/56 | (2006.01) | |
| H10K 50/15 | (2023.01) | |
| H10K 50/16 | (2023.01) | |
| H10K 50/805 | (2023.01) | |
| H10K 59/122 | (2023.01) | |
| H10K 59/123 | (2023.01) | |

(Continued)

(52) U.S. Cl.
CPC ........... *H10K 59/122* (2023.02); *H10K 50/15* (2023.02); *H10K 50/16* (2023.02); *H10K 50/805* (2023.02); *H10K 59/123* (2023.02); *H10K 59/131* (2023.02); *H10K 71/00* (2023.02); *H10K 59/1201* (2023.02)

(58) Field of Classification Search
CPC ........... H10K 59/131; H10K 59/80516; H10K 59/80522; H10K 50/814; H10K 50/824
See application file for complete search history.

(56) References Cited

U.S. PATENT DOCUMENTS

| | | |
|---|---|---|
| 9,881,980 B2 | 1/2018 | Paek et al. |
| 10,026,790 B2 * | 7/2018 | Kim ................. H10K 59/80522 |

(Continued)

FOREIGN PATENT DOCUMENTS

| | | |
|---|---|---|
| JP | 2011216250 A | 10/2011 |
| JP | 2019110115 A | 7/2019 |

(Continued)

*Primary Examiner* — Victoria K. Hall
(74) *Attorney, Agent, or Firm* — Seed Intellectual Property Law Group LLP

(57) ABSTRACT

An electroluminescent display device includes a substrate; a first electrode on the substrate; a connection pattern on the substrate, the connection pattern comprising a same material as the first electrode; a bank covering edges of the first electrode and the connection pattern; an auxiliary bank on the bank corresponding to the connection pattern; a light-emitting layer on the first electrode; and a second electrode on the light-emitting layer, the bank, and the auxiliary bank, wherein the auxiliary bank has a reversely inclined side surface, and wherein the light-emitting layer includes a hole auxiliary layer, a light-emitting material layer, and an electron auxiliary layer, the electron auxiliary layer has an opening exposing the connection pattern, and the second electrode contacts the connection pattern through the hole.

24 Claims, 12 Drawing Sheets

(51) Int. Cl.
    *H10K 59/131*     (2023.01)
    *H10K 71/00*     (2023.01)
    *H10K 59/12*     (2023.01)

(56) References Cited

U.S. PATENT DOCUMENTS

| | | | |
|---|---|---|---|
| 10,658,443 B2 * | 5/2020 | Beak | H10K 59/122 |
| 10,734,466 B2 | 8/2020 | Han et al. | |
| 11,563,067 B2 * | 1/2023 | Shin | H10K 59/122 |
| 2005/0236956 A1 * | 10/2005 | Chung | H10K 59/126 |
| | | | 313/463 |
| 2013/0017752 A1 | 1/2013 | Kajitani | |
| 2016/0351636 A1 * | 12/2016 | Lee | H10K 59/80522 |
| 2017/0125725 A1 | 5/2017 | Paek et al. | |
| 2018/0122877 A1 * | 5/2018 | Beak | H10K 59/1216 |
| 2018/0123088 A1 * | 5/2018 | Kim | H10K 50/8426 |
| 2020/0020878 A1 * | 1/2020 | Ajiki | H10K 59/80522 |
| 2021/0036073 A1 * | 2/2021 | Cho | H10K 59/122 |
| 2021/0066419 A1 * | 3/2021 | Byun | H10K 71/00 |
| 2021/0175304 A1 * | 6/2021 | Lee | H10K 59/88 |
| 2021/0175460 A1 | 6/2021 | Baek | |

FOREIGN PATENT DOCUMENTS

| | | |
|---|---|---|
| JP | 2020030933 A | 2/2020 |
| KR | 20160037369 A | 4/2016 |
| KR | 20170052767 A | 5/2017 |
| KR | 20210071369 A | 6/2021 |

\* cited by examiner

ELECTROLUMINESCENT DISPLAY DEVICE AND METHOD OF MANUFACTURING THE SAME

CROSS-REFERENCE TO RELATED APPLICATION

The present application claims the benefit of and priority to Korean Patent Application No. 10-2021-0174585, filed on Dec. 8, 2021, which is herein incorporated by reference in its entirety.

BACKGROUND

Technical Field

The present disclosure relates to an electroluminescent display device and a method of manufacturing the same.

Description of the Related Art

As one of flat panel display devices, an electroluminescent display device has wide viewing angles, as compared with a liquid crystal display device, because it is self-luminous. The electroluminescent display device also has advantages of a thinness, light weight, and low power consumption because a backlight unit is not necessary.

In addition, the electroluminescent display device is driven by low voltages of direct current (DC), and has a fast response time. Further, the electroluminescent display device is strong against the external impacts, and is used in a wide range of temperatures because its components are solids. Also, the electroluminescent display device can be manufactured at low cost.

BRIEF SUMMARY

In some cases, an electroluminescent display device includes a plurality of pixels, each of which has red, green, and blue sub-pixels, and displays various color images by allowing the red, green, and blue sub-pixels to selectively emit light. The red, green and blue sub-pixels have red, green, and blue light-emitting layers, respectively. Each light-emitting layer may be formed through a vacuum thermal evaporation process in which a luminous material is selectively deposited using a fine metal mask (FMM). However, the vacuum thermal evaporation process may increase manufacturing costs due to preparation of the fine metal mask, and may have a problem in application to a large-sized and high-definition display device due to manufacturing variations, sagging, shadow effect of the mask, and the like.

Accordingly, the present disclosure is directed to an electroluminescent display device that substantially obviates one or more of the problems due to limitations and disadvantages described above.

A technical benefit of the present disclosure is to provide an electroluminescent display device having a large size and high definition and a method of manufacturing the same.

Additional features and aspects will be set forth in the description that follows, and in part will be apparent from the description, or may be learned by practice of the present disclosure provided herein. Other features and aspects of the inventive concepts may be realized and attained by the structure particularly pointed out in the written description, or derivable therefrom, and the claims hereof as well as the appended drawings.

To achieve these and other aspects of the present disclosure, as embodied and broadly described herein, an electroluminescent display device includes a substrate; a first electrode on the substrate; a connection pattern on the substrate, the connection pattern comprising a same material as the first electrode; a bank covering edges of the first electrode and the connection pattern; an auxiliary bank on the bank corresponding to the connection pattern; a light-emitting layer on the first electrode; and a second electrode on the light-emitting layer, the bank, and the auxiliary bank, wherein the auxiliary bank has a reversely inclined side surface, and wherein the light-emitting layer includes a hole auxiliary layer, a light-emitting material layer, and an electron auxiliary layer, the electron auxiliary layer has a hole exposing the connection pattern, and the second electrode contacts the connection pattern through the hole.

In another aspect, a method of manufacturing an electroluminescent display device includes forming a first electrode and a connection pattern on a substrate; forming a bank on the first electrode and the connection pattern; forming an auxiliary bank on the bank corresponding to the connection pattern; forming a light-emitting layer on the first electrode; and forming a second electrode on the light-emitting layer, the bank, and the auxiliary bank, wherein the auxiliary bank has a reversely inclined side surface.

BRIEF DESCRIPTION OF THE SEVERAL VIEWS OF THE DRAWINGS

The accompanying drawings, which are included to provide a further understanding of the present disclosure and which are incorporated in and constitute a part of this application, illustrate aspects of the disclosure and together with the description serve to explain various principles of the present disclosure.

In the drawings.

DETAILED DESCRIPTION

Reference will now be made in detail to an exemplary embodiment of the disclosure, examples of which are illustrated in the accompanying drawings.

An electroluminescent display device according to an embodiment of the present disclosure may include a plurality of pixels to display an image, and each of the plurality of pixels may include red, green, and blue sub-pixels. A pixel region corresponding to each sub-pixel can have a configuration shown in the example of FIG. 1.

Figure 1:
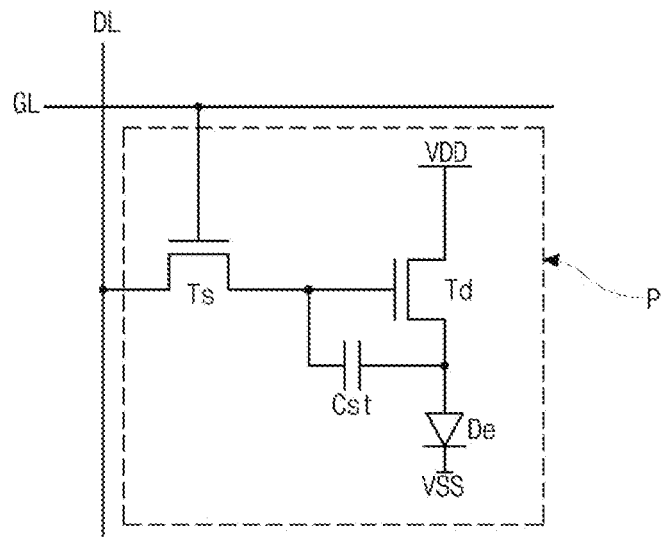
FIG. 1 is a circuit diagram of one pixel region of an electroluminescent display device according to an embodiment of the present disclosure.

FIG. 1 is a circuit diagram of one pixel region of an electroluminescent display device according to an embodiment of the present disclosure.

In FIG. 1, the electroluminescent display device according to the embodiment of the present disclosure may include a plurality of gate lines and a plurality of data lines crossing each other to define a plurality of pixel regions. For example, in the example of FIG. 1, a gate line GL and a data line DL cross each other to define a pixel region P. A switching thin film transistor Ts, a driving thin film transistor Td, a storage capacitor Cst, and a light-emitting diode De may be formed in each pixel region P.

For example, a gate electrode of the switching thin film transistor Ts may be connected to the gate line GL, and a source electrode of the switching thin film transistor Ts may be connected to the data line DL. A gate electrode of the driving thin film transistor Td may be connected to a drain electrode of the switching thin film transistor Ts, and a source electrode of the driving thin film transistor Td may be connected to a high voltage supply VDD (e.g., 1.5V or 3.3V). An anode of the light-emitting diode De may be connected to a drain electrode of the driving thin film transistor Td, and a cathode of the light-emitting diode De may be connected to a low voltage supply VSS (e.g., 0V). The storage capacitor Cst may be connected to the gate electrode and the drain electrode of the driving thin film transistor Td.

The electroluminescent display device may be driven to display an image. For example, when the switching thin film transistor Ts is turned on by a gate signal applied through the gate line GL, a data signal from the data line DL may be applied to the gate electrode of the driving thin film transistor Td and an electrode of the storage capacitor Cst through the switching thin film transistor Ts.

When the driving thin film transistor Td is turned on by the data signal, an electric current flowing through the light-emitting diode De may be controlled, thereby displaying an image. The light-emitting diode De may emit light due to the current supplied through the driving thin film transistor Td from the high voltage supply VDD.

For example, the amount of the current flowing through the light-emitting diode De may be proportional to the magnitude of the data signal, and the intensity of light emitted by the light-emitting diode De may be proportional to the amount of the current flowing through the light-emitting diode De. Thus, the pixel regions P may show different gray levels depending on the magnitude of the data signal. As a result, the electroluminescent display device may display an image.

In addition, the storage capacitor Cst may maintain charges corresponding to the data signal for a frame when the switching thin film transistor Ts is turned off. Accordingly, even if the switching thin film transistor Ts is turned off, the storage capacitor Cst may allow the amount of the current flowing through the light-emitting diode De to be constant, and the gray level shown by the light-emitting diode De to be maintained until a next frame.

One or more thin film transistors and/or capacitors can be added in the pixel region P, in addition to the switching and driving thin film transistors Ts and Td and the storage capacitor Cst. For example, in the electroluminescent display device, the driving thin film transistor Td may be turned on for a relatively long time while the data signal may be applied to the gate electrode of the driving thin film transistor Td and the light-emitting diode De may emit light, to thereby display the gray level. The driving thin film transistor Td can deteriorate due to application of the data signal for a long time. Therefore, the mobility and/or threshold voltage Vth of the driving thin film transistor Td may change over time. Thus, the pixel region P of the electroluminescent display device may display a different gray level with respect to the same data signal. This may cause non-uniform luminance, thereby lowering the image quality of the electroluminescent display device.

Accordingly, to compensate the change of the mobility and/or threshold voltage of the driving thin film transistor Td, at least one sensing thin film transistor and/or capacitor for sensing a voltage change can be further added in the pixel region P. The sensing thin film transistor and/or capacitor can be connected to a reference line for applying a reference voltage and outputting a sensing voltage.

In the electroluminescent display device according to the embodiment of the present disclosure, the light-emitting diode De may include a first electrode, a light-emitting layer, and a second electrode. The first electrode, the light-emitting layer, and the second electrode can be sequentially formed over a substrate, and the switching thin film transistor Ts, the driving thin film transistor Td, and the storage capacitor Cst can be formed between the substrate and the first electrode. The electroluminescent display device according to the embodiment of the present disclosure can be a top-emission type, in which light from the light-emitting layer of the light-emitting diode De is output toward a direction opposite the substrate, that is, output to the outside through the second electrode. The top-emission type display device can have a wider emission area than a bottom-emission type display device of the same size, which may improve luminance and reduce power consumption.

To transmit light, the second electrode may be formed of a metal material to have a thin thickness or formed of a transparent conductive material. According to this, the resistance of the second electrode can increase, and a voltage drop can occur due to the resistance, thereby causing a problem of non-uniform brightness.

Therefore, in the present disclosure, the second electrode may be electrically connected to an auxiliary electrode to decrease the resistance of the second electrode. The second electrode can be electrically connected to the auxiliary electrode through a connection pattern, and an organic layer can be removed between the connection pattern and the second electrode, so that the electrical contact property can be improved by decreasing the contact resistance between the connection pattern and the second electrode.

First Embodiment

Figure 2:
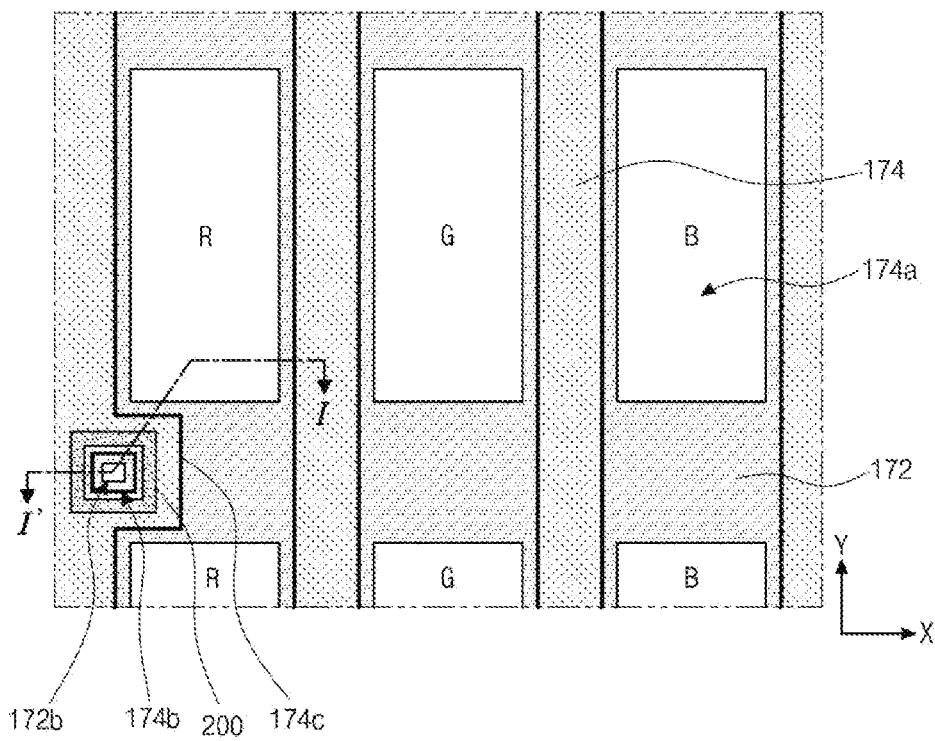
FIG. 2 is a schematic plan view of a pixel of an electroluminescent display device according to a first embodiment of the present disclosure.

FIG. 2 is a schematic plan view of a pixel of an electroluminescent display device according to a first embodiment of the present disclosure. FIG. 2 primarily shows a bank configuration.

In the example of FIG. 2, one pixel of the electroluminescent display device according to the first embodiment of the present disclosure may include red, green, and blue sub-pixels R, G, and B. Each of the red, green, and blue sub-pixels R, G, and B can have the circuit configuration of the pixel region P of the example of FIG. 1.

The red, green, and blue sub-pixels R, G, and B may be sequentially arranged along a first direction (e.g., an X-axis direction), which may be a horizontal direction in the context of the figure. The same color sub-pixels R, G, and B may be arranged along a second direction (e.g., a Y-axis direction), which may be perpendicular to the first direction (e.g., the X-axis direction). The red, green, and blue sub-pixels R, G, and B are illustrated as each having a rectangular shape with substantially angled corners, but embodiments are not limited thereto. Each of the red, green, and blue sub-pixels R, G, and B can have various shapes, such as a rectangular shape with substantially rounded corners, an oval shape, or the like.

The red, green, and blue sub-pixels R, G, and B can have the same size. Alternatively, the red, green, and blue sub-pixels R, G, and B can have different sizes. The sizes of the red, green, and blue sub-pixels R, G, and B may be determined by considering the lifetime of a light-emitting diode provided at each sub-pixel. For example, the size of the green sub-pixel G can be larger than the size of the red sub-pixel R, and smaller than the size of the blue sub-pixel B. However, embodiments of the present disclosure are not limited thereto.

In some cases, the red, green, and blue sub-pixels R, G, and B can be defined by a bank. The bank may include a first bank 172 having a hydrophilic property and a second bank 174 having a hydrophobic property.

For example, the first bank 172 may be disposed between adjacent same color sub-pixels R, G, and B, and between adjacent different color sub-pixels R, G, and B. The first bank 172 can surround each of the sub-pixels R, G, and B.

Alternatively, the first bank 172 can be omitted between the adjacent different color sub-pixels R, G, and B. That is, the first bank 172 can extend along the first direction (e.g., the X-axis direction), and can be formed only between the adjacent same color sub-pixels R, G, and B along the second direction (e.g., Y-axis direction).

The second bank 174 may be disposed on the first bank 172. The second bank 174 may have an opening 174a corresponding to a same color sub-pixel column, and may be disposed between adjacent different color sub-pixels R, G, and B along the first direction (e.g., the X-axis direction).

Accordingly, the opening 174a may extend in the second direction (e.g., the Y-axis direction), and the opening 174a may have a length of the second direction (e.g., the Y-axis direction) longer than a length of the first direction (e.g., the X-axis direction), for example, a width. The opening 174a may have a short side parallel to the first direction (e.g., the X-axis direction), and a long side parallel to the second direction (e.g., the Y-axis direction). The second bank 174 can have a narrower width than the first bank 172 between the adjacent different color sub-pixels R, G, and B along the first direction (e.g., the X-axis direction).

In addition, the second bank 174 can have an extension part 174c extending in the first direction (e.g., the X-axis direction) between the adjacent same color sub-pixels R, G, and B along the second direction (e.g., Y-axis direction). For example, the extension part 174c can be disposed between the adjacent red sub-pixels R along the second direction (e.g., the Y-axis direction), and can overlap the first bank 172. However, the location of the extension part 174c is not limited thereto. Alternatively, the extension part 174c can be disposed between the adjacent green sub-pixels G along the second direction (e.g., the Y-axis direction) or between the adjacent blue sub-pixels B along the second direction (e.g., the Y-axis direction).

The first bank 172 and the second bank 174 may have first and second auxiliary contact holes 172b and 174b corresponding to the extension part 174c, respectively.

Although not shown in the figure, an auxiliary electrode and a connection pattern may be formed to correspond to the extension part 174c where the first and second auxiliary contact holes 172b and 174b are formed, and the connection pattern may be exposed through the first and second auxiliary contact holes 172b and 174b. Accordingly, the second electrode of the light-emitting diode may be electrically connected to the auxiliary electrode through the connection pattern.

In addition, an auxiliary bank 200 may be formed on the second bank 174, that is, on the extension part 174c to correspond to the first and second auxiliary contact holes 172b and 174b. The auxiliary bank 200 may surround the first and second auxiliary contact holes 172b and 174b and expose a top surface of the second bank 174.

The auxiliary bank 200 may have a ring shape and may have substantially the same planar shape as the first and second auxiliary contact holes 172b and 174b. For example, as shown in FIG. 2, when the first and second auxiliary contact holes 172b and 174b have a rectangular shape in the plan view, the auxiliary bank 200 may have a rectangular ring shape. Alternatively, when the first and second auxiliary contact holes 172b and 174b have a circular shape in the plan view, the auxiliary bank 200 may have a circular ring shape.

In the electroluminescent display device according to the first embodiment of the present disclosure, the organic layer between the connection pattern and the second electrode may be removed using the auxiliary bank 200, so that the second electrode can be in direct contact with the connection pattern, and it may be possible to improve the electrical contact property between the connection pattern and the second electrode.

Example configurations of the electroluminescent display device according to the first embodiment of the present disclosure will be described in detail with reference to the drawings.

Figure 3:
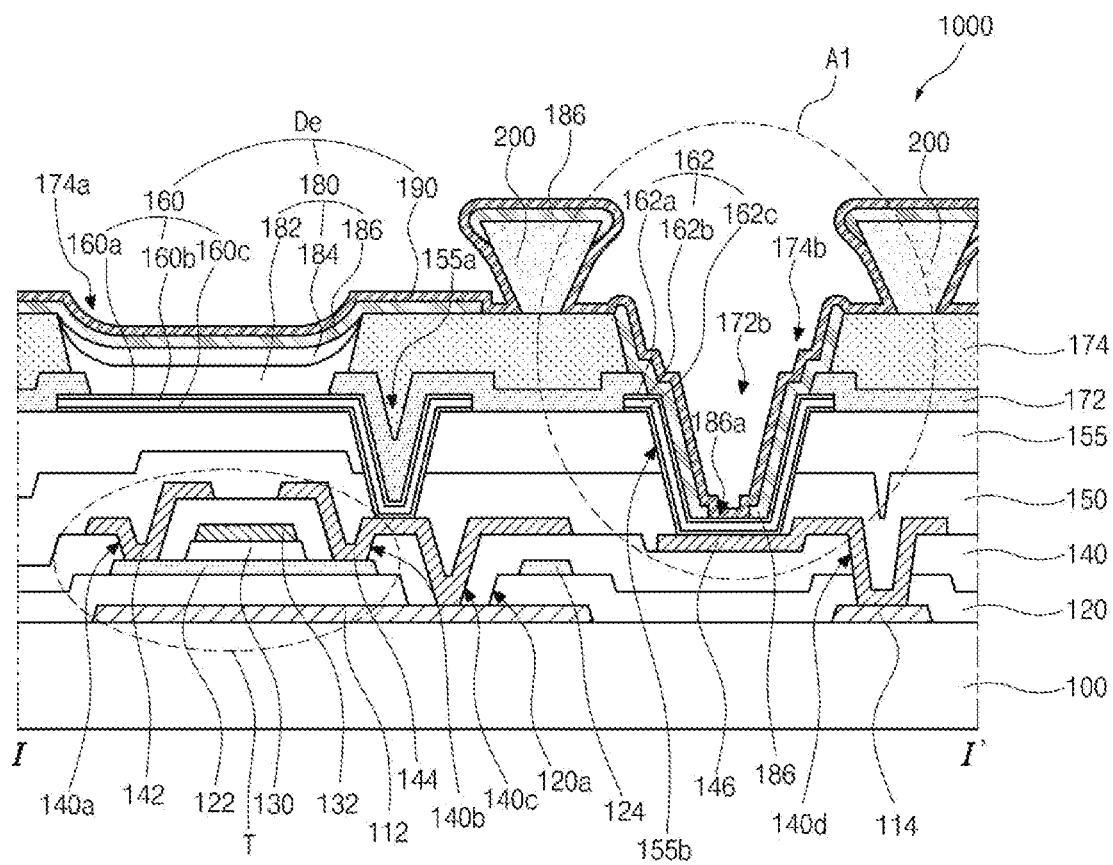
FIG. 3 is a schematic cross-sectional view of an electroluminescent display device according to a first embodiment of the present disclosure.

FIG. 3 is a schematic cross-sectional view of an electroluminescent display device according to a first embodiment of the present disclosure. FIG. 3 shows a cross-section corresponding to line I-I' of FIG. 2, and it will be described with reference to FIG. 2 together.

As shown in the example of FIG. 3, in the electroluminescent display device 1000 according to the first embodiment of the present disclosure, a light-blocking pattern 112 and a first auxiliary electrode 114 of a first conductive material, such as metal, may be formed on a substrate 100. The substrate 100 can be a glass substrate or a plastic substrate. For example, polyimide can be used for the plastic substrate, but embodiments are not limited thereto.

The light-blocking pattern 112 and the first auxiliary electrode 114 can be formed of one or more of: aluminum (Al), copper (Cu), molybdenum (Mo), titanium (Ti), chromium (Cr), nickel (Ni), tungsten (W), and an alloy thereof, and can have a single-layered structure or a multi-layered structure. For example, the light-blocking pattern 112 and the first auxiliary electrode 114 can have a double-layered structure including a lower layer of a molybdenum-titanium alloy (MoTi) and an upper layer of copper (Cu), and the upper layer can have be thicker than the lower layer.

The first auxiliary electrode 114 can extend in a first direction (e.g., the X-axis direction) and/or a second direction (e.g., the Y-axis direction) parallel to the substrate 100 in a plane. For example, the first auxiliary electrode 114 can extend in the first direction (e.g., the X-axis direction), and may correspond to a plurality of pixel regions arranged along the first direction (e.g., the X-axis direction). Otherwise, the first auxiliary electrode 114 can extend in the second direction (e.g., the Y-axis direction) crossing the first direction (e.g., the X-axis direction), and may correspond to a plurality of pixel regions arranged along the second direction (e.g., the Y-axis direction). Alternatively, the first auxiliary electrode 114 can extend in the first and second directions (X and Y-axis directions), and may have a lattice structure. However, embodiments of the present disclosure are not limited thereto.

A buffer layer 120 may be formed on the light-blocking pattern 112 and the first auxiliary electrode 114 substantially on an entire surface of the substrate 100. The buffer layer 120 can be formed of an inorganic insulating material, such as silicon oxide ($SiO_2$) or silicon nitride ($SiN_x$), and can be formed as a single layer or multiple layers.

The buffer layer 120 may have a buffer hole 120a on the light-blocking pattern 112. A top surface of the light-blocking pattern 112 may be partially exposed through the buffer hole 120a.

A semiconductor layer 122 and a capacitor electrode 124 may be patterned and formed on the buffer layer 120. The semiconductor layer 122 and the capacitor electrode 124 may be spaced apart from each other over the light-blocking pattern 112. The light-blocking pattern 112 may block light incident on the semiconductor layer 122, and reduce or prevent the semiconductor layer 122 from deteriorating due to the light.

The semiconductor layer 122 and the capacitor electrode 124 can be formed of polycrystalline silicon. In this case, the capacitor electrode 124 and both ends of the semiconductor layer 122 can be doped with impurities. Alternatively, the semiconductor layer 122 and the capacitor electrode 124 can be formed of an oxide semiconductor material.

A gate insulation layer 130 of an insulating material and a gate electrode 132 of a second conductive material may be sequentially formed on the semiconductor layer 122. The gate insulation layer 130 and the gate electrode 132 may be disposed to correspond to a center of the semiconductor layer 122.

The gate insulation layer 130 can be formed of an inorganic insulating material, such as silicon oxide ($SiO_2$) or silicon nitride ($SiN_x$). When the semiconductor layer 122 is made of an oxide semiconductor material, the gate insulation layer 130 may be formed of silicon oxide ($SiO_2$).

The gate electrode 132 can be formed of one or more of: aluminum (Al), copper (Cu), molybdenum (Mo), titanium (Ti), chromium (Cr), nickel (Ni), tungsten (W), and an alloy thereof, and can have a single-layered structure or a multi-layered structure. For example, the gate electrode 132 can have a double-layered structure, including a lower layer of a molybdenum-titanium alloy (MoTi) and an upper layer of copper (Cu), and the upper layer can be thicker than the lower layer.

As shown in FIG. 3, the gate insulation layer 130 can be patterned to have the same shape as the gate electrode 132. A width of the gate insulation layer 130 can be greater than a width of the gate electrode 132. Thus, edges of a top surface of the gate insulation layer 130 can be exposed. Alternatively, the width of the gate insulation layer 130 can be the same as the width of the gate electrode 132. Otherwise, the gate insulation layer 130 may not be patterned and can be formed substantially over the entire surface of the substrate 100.

A gate line (not shown) can be further formed of the same material and on the same layer as the gate electrode 132. The gate line can extend in the first direction (e.g., the X-axis direction). When the first auxiliary electrode 114 extends in the first direction (e.g., the X-axis direction), the gate line and the first auxiliary electrode 114 can be parallel to each other.

An interlayer insulation layer 140, made of an insulating material, may be formed on the gate electrode 132 substantially over the entire surface of the substrate 100. The interlayer insulation layer 140 can be formed of an inorganic insulating material, such as silicon oxide ($SiO_2$) or silicon nitride ($SiN_x$). Alternatively, the interlayer insulation layer 140 can be formed of an organic insulating material, such as photoacryl or benzocyclobutene.

The interlayer insulation layer 140 may have first, second, third, and fourth contact holes 140a, 140b, 140c, and 140d. The first and second contact holes 140a and 140b may expose the both ends of the semiconductor layer 122. The third contact hole 140c may partially expose the top surface of the light-blocking pattern 112, and may be located in the buffer hole 120a. Alternatively, the buffer hole 120a may be omitted, and the third contact hole 140c can be formed in the buffer layer 120, as well as in the interlayer insulation layer 140, to partially expose the top surface of the light-blocking pattern 112. The fourth contact hole 140d may be formed in the buffer layer 120, as well as in the interlayer insulation layer 140, to partially expose a top surface of the first auxiliary electrode 114.

Source and drain electrodes 142 and 144 and a second auxiliary electrode 146, made of a third conductive material, such as metal, may be formed on the interlayer insulation layer 140. The source and drain electrodes 142 and 144 and the second auxiliary electrode 146 can be formed of one or more of: aluminum (Al), copper (Cu), molybdenum (Mo), titanium (Ti), chromium (Cr), nickel (Ni), tungsten (W), and an alloy thereof, and can have a single-layered structure or a multi-layered structure. For example, the source and drain electrodes 142 and 144 and the second auxiliary electrode 146 can have a double-layered structure, including a lower layer of a molybdenum-titanium alloy (MoTi) and an upper layer of copper (Cu), and the upper layer can be thicker than the lower layer. Alternatively, for example, the source and drain electrodes 142 and 144 and the second auxiliary electrode 146 can have a triple-layered structure.

The source and drain electrodes 142 and 144 may be spaced apart from each other substantially, with the gate electrode 132 positioned therebetween. The source and drain electrodes 142 and 144 may contact both ends of the semiconductor layer 122, through the first and second contact holes 140a and 140b, respectively. Further, the drain electrode 144 may contact the light-blocking pattern 112 through the third contact hole 140c, and may overlap the capacitor electrode 124. The capacitor electrode 124 may overlap the light-blocking pattern 112 and the drain electrode 144 to form a storage capacitor.

Meanwhile, the second auxiliary electrode 146 may overlap and contact the first auxiliary electrode 114 through the fourth contact hole 140d. The second auxiliary electrode 146 can extend in the second direction (e.g., the Y-axis direction), and may correspond to the plurality of pixel regions arranged along the second direction (e.g., the Y-axis direction). However, embodiments of the present disclosure are not limited thereto.

In addition, a data line (not shown) and a high voltage supply line (not shown) can be further formed on the interlayer insulation layer 140, and can be made of the third conductive material. The data line and the high voltage supply line can extend in the second direction (e.g., the Y-axis direction). Accordingly, the data line, the high voltage supply line, and the second auxiliary electrode 146 can be parallel to each other.

The semiconductor layer 122, the gate electrode 132, and the source and drain electrodes 142 and 144 may form a thin film transistor T. The thin film transistor T may have a coplanar structure in which the gate electrode 132 and the source and drain electrodes 142 and 144 may be located at the same side with respect to the semiconductor layer 122.

Alternatively, the thin film transistor T can have an inverted staggered structure in which the gate electrode and the source and drain electrodes may be located at different sides with respect to the semiconductor layer. That is, the gate electrode can be disposed under the semiconductor layer, and the source and drain electrodes can be disposed over the semiconductor layer. In this case, the semiconductor layer can be formed of oxide semiconductor or amorphous silicon.

The thin film transistor T may correspond to a driving thin film transistor Td of FIG. 1, and a switching thin film transistor Ts of FIG. 1 having the same structure as the driving thin film transistor T can be further formed on the substrate 100. The gate electrode 132 of the driving thin film transistor can be connected to a drain electrode of the switching thin film transistor, and the source electrode 142 of the driving thin film transistor may be connected to the power supply line. In addition, a gate electrode and a source electrode of the switching thin film transistor can be connected to the gate line and the data line, respectively.

A passivation layer 150 of an insulating material may be formed on the source and drain electrodes 142 and 144 and the second auxiliary electrode 146, substantially over the entire surface of the substrate 100. The passivation layer 150 can be formed of an inorganic insulating material, such as silicon oxide ($SiO_2$) or silicon nitride ($SiN_x$).

Next, an overcoat layer 155 of an insulating material may be formed on the passivation layer 150, substantially over the entire surface of the substrate 100. The overcoat layer 155 can be formed of an organic insulating material such as photoacryl or benzocyclobutene. The overcoat layer 155 can eliminate level differences due to lower layers, and may have a substantially flat top surface.

One of the passivation layer 150 and the overcoat layer 155 can be omitted. For example, the passivation layer 150 can be omitted, but embodiments are not limited thereto.

The passivation layer 150 and the overcoat layer 155 may have a drain contact hole 155a exposing the drain electrode 144. Further, the passivation layer 150 and the overcoat layer 155 may have a fifth contact hole 155b exposing the second auxiliary electrode 146.

A first electrode 160 having a relatively high work function may be formed on the overcoat layer 155. The first electrode 160 may be in contact with the drain electrode 144 through the drain contact hole 155a.

The first electrode 160 may include a first layer 160a and a second layer 160b, and the second layer 160b may be disposed between the first layer 160a and the substrate 100, for example, between the first layer 160a and the overcoat layer 155.

The first layer 160a may be formed of a conductive material having a relatively high work function. For example, the first layer 160a can be formed of a transparent conductive material, such as indium tin oxide (ITO) or indium zinc oxide (IZO). The second layer 160b may be formed of a metal material having relatively high reflectance. For example, the second layer 160b can be formed of silver (Ag) or aluminum (Ag), but embodiments are not limited thereto. The work function of the first layer 160a may be higher than the work function of the second layer 160b.

A thickness of the second layer 160b can be greater than a thickness of the first layer 160a. For example, the thickness of the second layer 160b can be 80 nm to 100 nm, and the thickness of the first layer 160a can be 10 nm to 80 nm. However, embodiments of the present disclosure are not limited thereto.

In addition, the first electrode 160 can further include a third layer 160c between the second layer 160b and the overcoat layer 155. Accordingly, the first electrode 160 can have a triple-layered structure. For example, the third layer 160c can be formed of a transparent conductive material, such as ITO or IZO, but embodiments are not limited thereto.

A thickness of the third layer 160c can be smaller than the thickness of the first layer 160a, and can be smaller than or equal to the thickness of the second layer 160b. For example, the thickness of the third layer 160c can be 10 nm, but embodiments are not limited thereto.

The third layer 160c may be formed to improve the adhesion property between the second layer 160b and the overcoat layer 155. The third layer 160c can be omitted, and in this case, the first electrode 160 can have a double-layered structure.

In addition, a connection pattern 162 may be formed on the overcoat layer 155, and may be formed of the same material as the first electrode 160. Accordingly, the connection pattern 162 can include first, second, and third layers 162a, 162b, and 162c. The second layer 162b may be disposed between the first layer 162a and the third layer 162c, and the third layer 162c may be disposed between the second layer 162b and the substrate 100, for example, between the second layer 162b and the overcoat layer 155. The connection pattern 162 may be in contact with the second auxiliary electrode 146 through the fifth contact hole 155b.

As described above, when the third layer 160c of the first electrode 160 is omitted and the first electrode 160 is configured as having two layers, the third layer 162c of the connection pattern 162 may also be omitted and the connection pattern 162 may have a double-layered structure.

A bank of an insulating material may be formed on the first electrode 160. The bank may include a first bank 172 having a hydrophilic property and a second bank 174 having a hydrophobic property.

For example, the first bank 172 may overlap and cover edges of the first electrode 160, and may expose a central portion of the first electrode 160. The first bank 172 may be in contact with the edges of the first electrode 160. The first bank 172 may also be formed on the connection pattern 162, and may overlap and cover edges of the connection pattern 162. The first bank 172 may have a first auxiliary contact hole 172b exposing a central portion of the connection pattern 162.

The first bank 172 can be formed of a material having a hydrophilic property, for example, an inorganic insulating material, such as silicon oxide ($SiO_2$) or silicon nitride ($SiN_x$). Alternatively, the first bank 172 can be formed of polyimide.

The second bank 174 may be formed on the first bank 172. At least a top surface of the second bank 174 may be hydrophobic, and a side surface of the second bank 174 can be hydrophobic or hydrophilic.

The second bank 174 may have an opening 174a exposing the central portion of the first electrode 160. As described above, the second bank 174 can be formed between adjacent different color sub-pixels, and the opening 174a of the second bank 174 can be formed to correspond to the same color sub-pixel column.

The second bank 174 may be disposed on the first bank 172 with a narrower width than the first bank 172, and may expose edges of the first bank 172. In addition, a thickness of the second bank 174 can be greater than a thickness of the first bank 172. For example, the thickness of the second bank 174 can be 1 µm to 2 µm, but embodiments are not limited thereto.

As described above, the first bank 172 can be omitted between the adjacent same different sub-pixels. In this case, the second bank 174 can overlap and be in contact with the edges of the first electrode 160.

The second bank 174 can be formed of an organic insulating material having a hydrophobic property. Alternatively, the second bank 174 can be formed of an organic insulating material having a hydrophilic property and subjected to a hydrophobic treatment.

Further, the second bank 174 may have a second auxiliary contact hole 174b corresponding to the first auxiliary contact hole 172b. The connection pattern 162 may be exposed through the first and second auxiliary contact holes 172b and 174b. Here, the second auxiliary contact hole 174b can have a larger area and width than the first auxiliary contact hole 172b.

In one embodiment, only the first bank 172 may be disposed on other edges of the first electrode 160 not shown in the figure.

In addition, the first bank 172 and the second bank 174 may be formed of different materials, and may be separated from each other in FIG. 3. However, the hydrophilic first bank 172 and the hydrophobic second bank 174 can be formed of the same material, and may be formed as one body. For example, an organic material layer having a hydrophobic top surface can be formed substantially over the entire surface of the substrate 100, can be exposed to light through a halftone mask including a light-transmitting portion, a light-blocking portion and a half light-transmitting portion, and can be patterned, thereby forming the hydrophilic first bank 172 and the hydrophobic second bank 174 having different widths and different thicknesses.

An auxiliary bank 200 may be formed on the second bank 174 corresponding to the connection pattern 162. The auxiliary bank 200 may have a reversely inclined side surface, and the top surface of the second bank 174 may be exposed between the auxiliary bank 200 and the second auxiliary contact hole 174b. The auxiliary bank 200 will be described in detail below.

Next, a light-emitting layer 180 may be formed on the first electrode 160 exposed by the first and second banks 172 and 174, the second bank 174, and the auxiliary bank 200. The light-emitting layer 180 can include a first charge auxiliary layer 182, a light-emitting material layer 184, and a second charge auxiliary layer 186, that may be sequentially positioned over the first electrode 160. The light-emitting material layer 184 can be formed of any one of red, green, and blue luminescent materials, but embodiments are not limited thereto. The luminescent material can be an organic luminescent material, such as a phosphorescent compound or a fluorescent compound, or can be an inorganic luminescent material, such as a quantum dot.

The first charge auxiliary layer 182 can be a hole auxiliary layer, and the hole auxiliary layer can include at least one of a hole injecting layer (HIL) and a hole transporting layer (HTL). In addition, the second charge auxiliary layer 186 can be an electron auxiliary layer, and the electron auxiliary layer can include at least one of an electron injecting layer (EIL) and an electron transporting layer (ETL). The first charge auxiliary layer 182 and the second charge auxiliary layer 186 may have organic layers. However, embodiments of the present disclosure are not limited thereto.

Here, each of the first charge auxiliary layer 182 and the light-emitting material layer 184 can be formed through a solution process. Thus, the process can be simplified, and a display device with a large size and high resolution can be provided. A spin coating method, an ink jet printing method, or a screen printing method can be used as the solution process, but embodiments of the present disclosure are not limited thereto. In some cases, the first charge auxiliary layer 182 and the light-emitting material layer 184 can be formed only in the opening 174a, and at least one side surface of each of the first charge auxiliary layer 182 and the light-emitting material layer 184 can be surrounded by the first and second banks 172 and 174.

As described above, because the opening 174a of the second bank 174 may be formed to correspond to the same color sub-pixel column, solutions dropped into respective pixel regions corresponding to the same color sub-pixel column through different nozzles may be connected to each other, and each of the first charge auxiliary layer 182 and the light-emitting material layer 184 may be formed by drying the solutions. Thus, the first charge auxiliary layers 182 or the light-emitting material layers 184 in adjacent pixel regions corresponding to the same color sub-pixel column may be connected to each other and formed as one body. Accordingly, the deviation between the dropping amounts of the nozzles can be reduced or minimized, and the thicknesses of the thin films formed in the respective pixel regions can be uniform.

When the solution is dried, a drying speed of a solvent in a region adjacent to the second bank 174 may be different from that in other regions. That is, the drying speed of the solvent in the region adjacent to the second bank 174 may be faster than that in the other regions. Therefore, a height of each of the first charge auxiliary layer 182 and the light-emitting material layer 184 in the region adjacent to the second bank 174 can rise as it gets closer to the second bank 174.

On the other hand, the second charge auxiliary layer 186 can be formed through a thermal evaporation process. Accordingly, the second charge auxiliary layer 186 can be formed substantially over the entire surface of the substrate 100. That is, the second charge auxiliary layer 186 can be formed on the top surface of the second bank 174 as well as in the opening 174a, and can also be formed on the connection pattern 162. In this case, the second charge auxiliary layer 186 on the connection pattern 162 can have an opening 186a exposing the connection pattern 162, and the opening 186a can be disposed in the first and second auxiliary contact holes 172b and 174b. The opening 186a of the second charge auxiliary layer 18 can be formed using the auxiliary bank 200.

Figure 4:
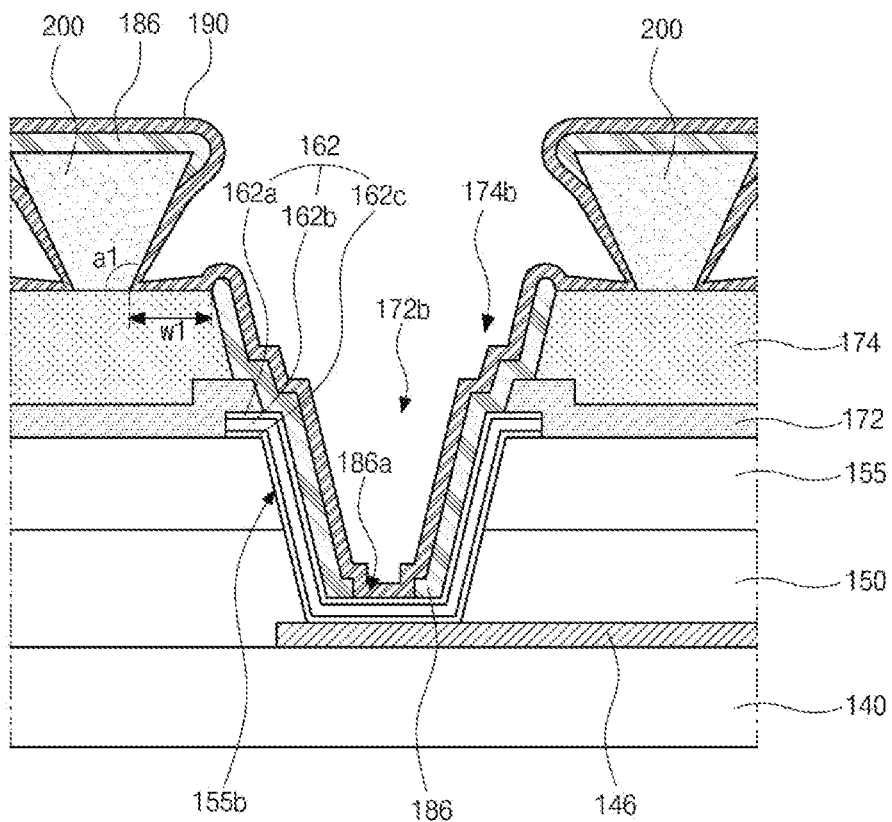
FIG. 4 is an enlarged cross-sectional view of the area A1 of FIG. 3.

The opening 186a is formed in a contact region as shown in FIG. 4. This contact region is where the second auxiliary electrode 146, the connection pattern 162 and the second electrode 190 are in electrical contact with each other. In some embodiments, the second charge auxiliary layer 186 is also in direct physical contact with the connection pattern 162 in this contact region, as shown in FIG. 4. Meanwhile, the second charge auxiliary layer 186 can also be formed on the auxiliary bank 200. The second charge auxiliary layer 186 on the auxiliary bank 200 can be separated from the second charge auxiliary layer 186 on the second bank 174 and the second charge auxiliary layer 186 on the connection pattern 162. In this case, the second charge auxiliary layer 186 may not be formed on a side surface of the auxiliary bank 200 and the top surface of the second bank 174 adjacent to the auxiliary bank 200, and this will be described in detail below.

Next, a second electrode 190 of a conductive material, having relatively low work function, may be formed on the light-emitting layer 180 substantially over the entire surface of the substrate 100. Specifically, the second electrode 190 may be formed on the second charge auxiliary layer 186 and may also be formed on the top surface of the second bank 174 and the side surface of the auxiliary bank 200 where the second charge auxiliary layer 186 is not formed. Accordingly, the second electrode 190 may be in contact with the top surface of the second bank 174 and the side surface of the auxiliary bank 200.

The second electrode 190 can be formed of one or more of: aluminum (Al), magnesium (Mg), silver (Ag), and an alloy thereof. The second electrode 190 may be relatively thin, such that light from the light-emitting layer 180 can be transmitted therethrough. For example, the second electrode 190 can have the thickness of 5 nm to 10 nm, but embodiments are not limited thereto. Alternatively, the second electrode 190 can be formed of a transparent conductive material, such as indium-gallium-oxide (IGO) or IZO.

The second electrode 190 may be electrically connected to the connection pattern 162 through the first and second auxiliary contact holes 172b and 174b. Accordingly, the second electrode 190 may be electrically connected to the first and second auxiliary electrodes 114 and 146 through the connection pattern 162. The second charge auxiliary layer 186 may be disposed between the connection pattern 162 and the second electrode 190. Because the second charge auxiliary layer 186 may have an insulating property and may act as a resistor, a contact property between the second electrode 190 and the connection pattern 162 may be lowered.

However, the opening 186a exposing the connection pattern 162 according to an embodiment may be formed in the second charge auxiliary layer 186, and the second electrode 190 may be in direct contact with the connection pattern 162 through the opening 186a. Thus, the contact property between the second electrode 190 and the connection pattern 162 can increase.

The first electrode 160, the light-emitting layer 180, and the second electrode 190 may constitute a light-emitting diode De. The first electrode 160 can serve as an anode, and the second electrode 190 can serve as a cathode, but embodiments are not limited thereto.

As described above, the electroluminescent display device 1000 according to the first embodiment of the present disclosure can be a top-emission type in which light from the light-emitting layer 180 of the light-emitting diode De may be output toward a direction opposite the substrate 100, that is, output to the outside through the second electrode 190.

The light-emitting diode De of each pixel region can have an element thickness for a micro-cavity effect corresponding to a wavelength of the emitted light, thereby increasing the light efficiency.

Although not shown in the figure, a capping layer can be formed on the second electrode 190 substantially over the entire surface of the substrate 100. The capping layer can be formed of an insulating material having a relatively high refractive index. The wavelength of light traveling along the capping layer can be amplified by surface plasma resonance. Thus, the intensity of the peak can be increased, thereby improving the light efficiency in the top-emission type electroluminescent display device. For example, the capping layer can be formed as a single layer of an organic layer or an inorganic layer, or may be formed as organic/inorganic stacked layers.

As described above, in the electroluminescent display device 1000 according to the first embodiment of the present disclosure, by forming some of the light-emitting layer 180 through the solution process, a mask may be omitted. Thereby the manufacturing costs may be reduced, and a display device with a large size and high definition can be implemented.

In addition, the electroluminescent display device 1000 according to the first embodiment of the present disclosure can be configured as the top-emission type, thereby improving luminance and reducing power consumption. The second electrode 190 may be relatively thin or may be formed of a transparent conductive material to transmit light, and its resistance may increase. However, the second electrode 190 may be connected to the first and second auxiliary electrodes 114 and 146 through the connection pattern 162, so that the resistance of the second electrode 190 can be decreased.

The opening 186a may be formed in the second charge auxiliary layer 186 using the auxiliary bank 200, and the second electrode 190 may be in direct contact with the connection pattern 162, so that the contact properties between the second electrode 190 and the connection pattern 162 can be improved. One of the first and second auxiliary electrodes 114 and 146 can be omitted.

The configurations of the auxiliary bank 200, the second charge auxiliary layer 186, and the second electrode 190 according to the first embodiment of the present disclosure will be described in detail with reference to FIG. 4.

FIG. 4 is an enlarged cross-sectional view of the area Al of FIG. 3.

As shown in the example of FIG. 4, the auxiliary bank 200 may be formed on the second bank 174 corresponding to the connection pattern 162. The auxiliary bank 200 may be formed of an insulating material. For example, the auxiliary bank 200 may be formed of polyimide or an acrylic resist.

The auxiliary bank 200 may be used for forming the opening 186a in the second charge auxiliary layer 186. The auxiliary bank 200 may cut off the second charge auxiliary layer 186 to expose the top surface of the second bank 174 having the hydrophobic property and may allow the second electrode 190 to be continuously connected.

Here, a width w1 of the top surface of the second bank 174 exposed by the second charge auxiliary layer 186, beneficially, may be 5 μm to 8 μm. To do this, the auxiliary bank 200 may have a predetermined thickness and a reversely inclined side surface. Namely, the top surface of the auxiliary bank 200 is wider and has a larger surface area than the bottom surface and the side surface of the auxiliary bank 200 has a reverse inclination angle a1 more than 90 degrees with respect to a plane parallel to the substrate 100 of FIG. 3. Thus, the auxiliary bank tapers downward, like a cone, being smaller at the lower end.

As the thickness of the auxiliary bank 200 increases and the reverse inclination angle a1 increases, the coverage characteristic decreases, so that the film may be cut off.

In general, the faster the deposition rate of the material to be deposited, the lower the coverage characteristics, and the smaller the thickness of the material to be deposited, the lower the coverage characteristics. The second charge auxiliary layer 186 including an organic layer has the lower coverage characteristics than the second electrode 190 formed of a metal or a transparent conductive material.

For example, the thickness of the second charge auxiliary layer 186 can be 20 nm to 25 nm, and the thickness of the second electrode 190 can be 10 nm to 15 nm.

Accordingly, to disconnect the second charge auxiliary layer 186 and connect the second electrode 190, it is desirable that the thickness of the auxiliary bank 200 may be more than 1.5 μm and less than 2.0 μm. If the thickness of the auxiliary bank 200 is equal to or less than 1.5 μm, the second charge auxiliary layer 186 cannot be disconnected, so that the top surface of the second bank 174 cannot be exposed. If the thickness of the auxiliary bank 200 is equal to or more than 2.0 μm, the second electrode 190 can be disconnected, so that a voltage cannot be applied to the second electrode 190.

Further, it is desirable that the reverse inclination angle a1 may be more than 120 degrees and less than 150 degrees. If the reverse inclination angle a1 is equal to or less than 120 degrees, the second charge auxiliary layer 186 cannot be disconnected, so that the top surface of the second bank 174 cannot be exposed. If the reverse inclination angle a1 is equal to or more than 150 degrees, the second electrode 190 can be disconnected, so that a voltage cannot be applied to the second electrode 190.

Meanwhile, the first and second banks 172 and 174 may have regularly inclined side surfaces. That is, the side surfaces of the first and second banks 172 and 174 can have inclination angles less than 90 degrees with respect to the plane parallel to the substrate 100 of FIG. 3.

Since the second charge auxiliary layer 186 may not be formed substantially on the side surface of the auxiliary bank 200, the second charge auxiliary layer 186 formed on the auxiliary bank 200 may be disconnected and separated from the second charge auxiliary layer 186 formed on the connection pattern 162, so that the top surface of the second bank 174 can be exposed. Here, the second charge auxiliary layer 186 may be formed only on an upper portion of the side surface of the auxiliary bank 200.

In addition, the second charge auxiliary layer 186 may have the opening 186a exposing the connection pattern 162 in the first and second auxiliary contact holes 172b and 174b. The opening 186a can be formed using the auxiliary bank 200 and the second bank 174 exposed by the second charge auxiliary layer 186.

Next, the second electrode 190 may be formed on the second charge auxiliary layer 186 substantially over the entire surface of the substrate 100 of FIG. 3. The second electrode 190 may also be formed on the side surface of the auxiliary bank 200 and the top surface of the second bank 174 and may be in contact with the side surface of the auxiliary bank 200 and the top surface of the second bank 174. Here, the thickness of the second electrode 190 on the side surface of the auxiliary bank 200 can be thinner downward, that is, closer to the second bank 174.

The second electrode 190 may be in direct contact with the connection pattern 162 exposed through the opening 186a. Accordingly, the contact property between the second electrode 190 and the connection pattern 162 can increase.

A method of manufacturing the electroluminescent display device 1000 according to the first embodiment of the present disclosure will be described in detail with reference to FIGS. 5A to 5G.

FIGS. 5A to 5G are cross-sectional views schematically illustrating the electroluminescent display device in steps of a manufacturing process of the same according to the first embodiment of the present disclosure. FIGS. 5A to 5G correspond to the line I-I' of FIG. 2.

Figure 5A:
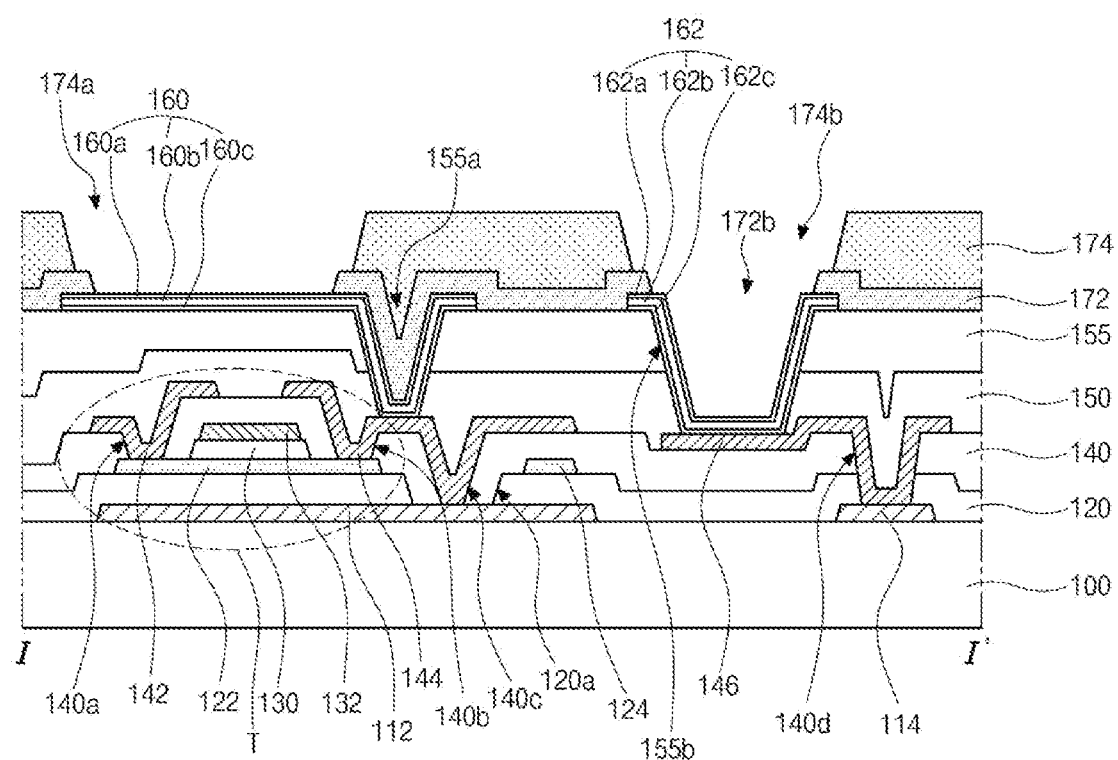
FIGS. 5A to 5G are cross-sectional views schematically illustrating the electroluminescent display device in steps of a manufacturing process of the same according to the first embodiment of the present disclosure.

In FIG. 5A, a light-blocking pattern 112 and a first auxiliary electrode 114 may be formed on an insulating substrate 100 by depositing a first conductive material and patterning it through a first mask process.

Next, a buffer layer 120 may be formed on the light-blocking pattern 112 and the first auxiliary electrode 114 by depositing an inorganic insulating material substantially over an entire surface of the substrate 100 and may be patterned through a second mask process, thereby forming a buffer hole 120a partially exposing a top surface of the light-blocking pattern 112.

Then, a semiconductor layer 122 and a capacitor electrode 124 may be formed on the buffer layer 120 by depositing a semiconductor material and patterning it through a third mask process. The semiconductor layer 122 and the capacitor electrode 124 may be spaced apart from each other over the light-blocking pattern 112.

The semiconductor material can be polycrystalline silicon, and in this case, both ends of the semiconductor layer 122 and the capacitor electrode 124 can be doped with impurities later. Alternatively, the semiconductor material can be an oxide semiconductor material.

A gate insulation layer 130 and a gate electrode 132 may be formed by sequentially depositing an inorganic insulating material and a second conductive material on the semiconductor layer 122 and the capacitor electrode 124 and patterning them through a fourth mask process. The gate insulation layer 130 and the gate electrode 132 may be disposed to correspond to a center of the semiconductor layer 122.

Then, an interlayer insulation layer 140 may be formed on the gate electrode 132 and the capacitor electrode 124 by depositing an inorganic insulating material or applying an organic insulating material substantially over the entire surface of the substrate 100 and may be patterned through a fifth mask process, thereby forming first, second, third, and fourth contact holes 140a, 140b, 140c, and 140d. At this time, the buffer layer 120 can also be selectively removed.

The first and second contact holes 140a and 140b may expose the both ends of the semiconductor layer 122. The third contact hole 140c may partially expose the top surface of the light-blocking pattern 112 corresponding to the buffer hole 120a. Here, the buffer hole 120a can be omitted, and the third contact hole 140c can be formed in the buffer layer 120 as well as in the interlayer insulation layer 140 to partially expose the top surface of the light-blocking pattern 112. In this case, the second mask process can be omitted. In addition, the fourth contact hole 140d may be formed in the buffer layer 120 as well as in the interlayer insulation layer 140 to partially expose a top surface of the first auxiliary electrode 114.

Next, source and drain electrodes 142 and 144 and a second auxiliary electrode 146 may be formed on the interlayer insulation layer 140 by depositing a third conductive material and patterning it through a sixth mask process.

The source and drain electrodes 142 and 144 may be in contact with the both ends of the semiconductor layer 122 through the first and second contact holes 140a and 140b, respectively. Further, the drain electrode 144 may contact the light-blocking pattern 112 through the third contact hole 140c and may overlap the capacitor electrode 124.

Meanwhile, the second auxiliary electrode 146 may contact the first auxiliary electrode 114 through the fourth contact hole 140d.

Next, a passivation layer 150 may be formed on the source and drain electrodes 142 and 144 and the second auxiliary electrode 146 by depositing an inorganic insulating material, and an overcoat layer 155 may be formed on the passivation layer 150 by applying an organic insulating material. Then, the passivation layer 150 and the overcoat layer 155 may be patterned through a seventh mask process, thereby forming a drain contact hole 155a and a fifth contact hole 155b.

The drain contact hole 155a may partially expose the drain electrode 144, and the fifth contact hole 155b may partially expose the second auxiliary electrode 146.

Here, it has been described that the passivation layer 150 and the overcoat layer 155 may be patterned through the same mask process, but the passivation layer 150 and the overcoat layer 155 can be patterned through different mask processes. For example, after the passivation layer 150 may be formed by depositing an inorganic insulating material and patterned through a mask process, the overcoat layer 155 can be formed by applying an organic insulating material and can be patterned through another mask process.

Next, a first electrode 160 and a connection pattern 162 may be formed on the overcoat layer 155 by sequentially depositing first, second, and third conductive layers and patterning them through an eighth mask process.

Here, the first and third conductive layers can be formed of ITO or IZO, and the second conductive layer can be formed of silver (Ag), aluminum (Al) or molybdenum (Mo).

The first electrode 160 and the connection pattern 162 each may include a first layer 160a and 162a, a second layer 160b and 162b, and a third layer 160c and 162c. The second layer 160b and 162b may be disposed between the first layer 160a and 162a and the third layer 160c and 162c, and the third layer 160c and 162c may be disposed between the second layer 160b and 162b and the overcoat layer 155.

The first electrode 160 may be in contact with the drain electrode 144 through the drain contact hole 155a. In addition, the connection pattern 162 may be in contact with the second auxiliary electrode 146 through the fifth contact hole 155b.

Next, a bank exposing the first electrode 160 and the connection pattern 162 may be formed on the first electrode 160 and the connection pattern 162 by depositing or applying an insulating material and patterning it through one mask process or two mask processes. The bank may include a first bank 172 of a hydrophilic property and a second bank 174 of a hydrophobic property.

The first bank 172 may cover edges of the first electrode 160, and may expose a central portion of the first electrode 160. The second bank 174 may have an opening 174a exposing the central portion of the first electrode 160. In addition, the first bank 172 and the second bank 174 may have a first auxiliary contact hole 172b and a second auxiliary contact hole 174b exposing the connection pattern 162, respectively. The first bank 172 may have a hydrophilic property, and at least a top surface of the second bank 174 may have a hydrophobic property.

Figure 5B:
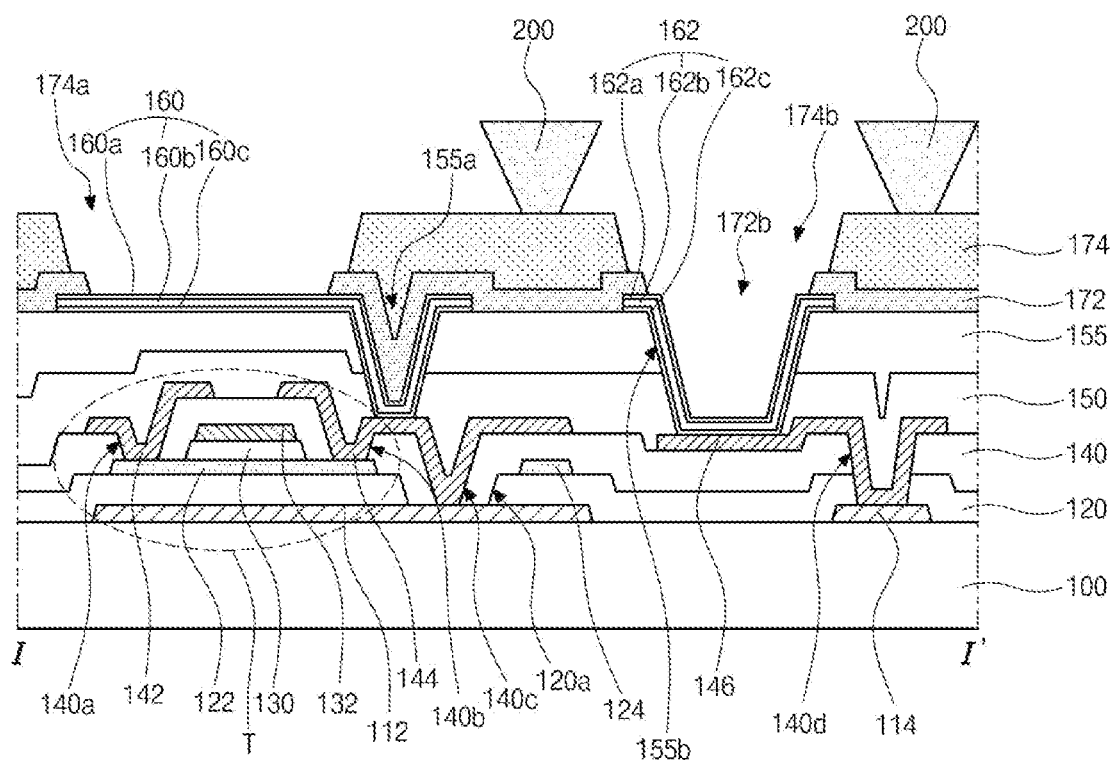

Next, in FIG. 5B, an auxiliary bank 200 of an insulating material may be formed on the second bank 174 corresponding to the connection pattern 162. The auxiliary bank 200 may be spaced apart from the second auxiliary contact hole 174b and may surround the second auxiliary contact hole 174. The auxiliary bank 200 may have a reversely inclined side surface. In some cases, the auxiliary bank 200 may comprise one or more insulating material structures that have a reverse tapered profile. The hydrophobic top surface of the second bank 174 may be exposed between the auxiliary bank 200 and the second auxiliary contact hole 174b. The auxiliary bank 200 may have a hydrophilic property.

It is beneficial that a width w1 of FIG. 4 of the top surface of the second bank 174 exposed between the auxiliary bank 200 and the second auxiliary contact hole 174b may be 5 μm to 8 μm, a thickness of the auxiliary bank 200 may be more than 1.5 μm and less than 2.0 μm, and a reverse inclination angle a1 of FIG. 4 of the side surface of the auxiliary bank 200 may be more than 120 degrees and less than 150 degrees.

Figure 5C:
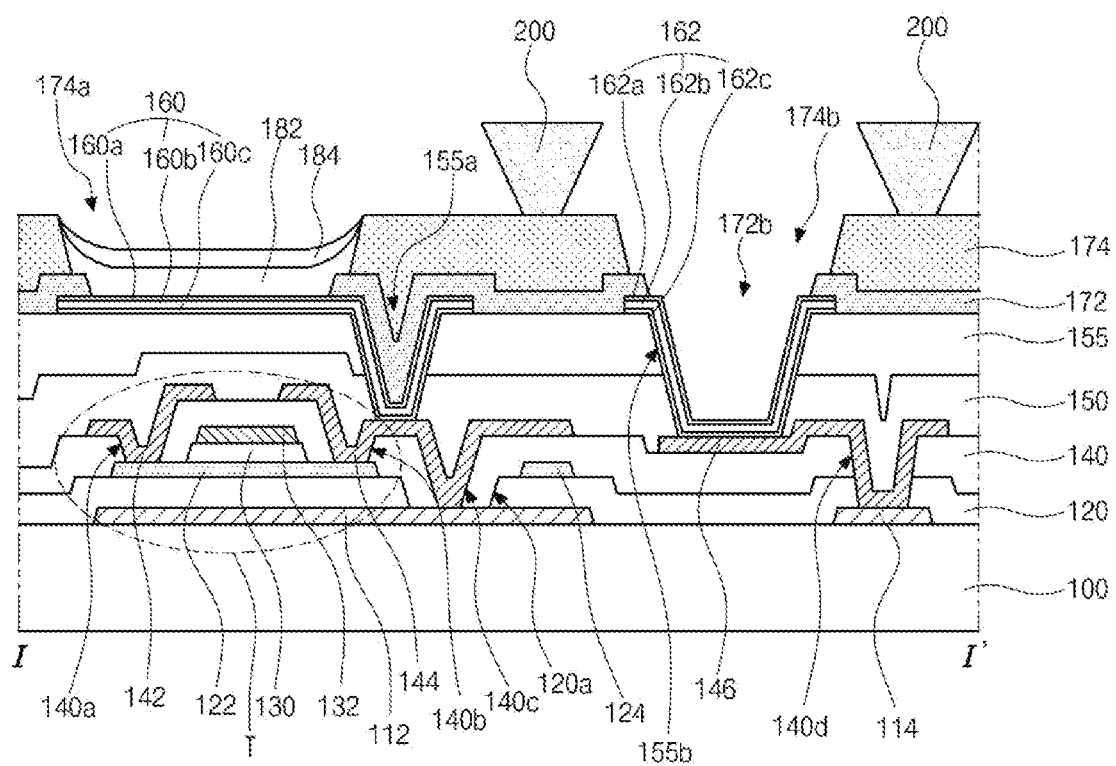

In FIG. 5C, a first charge auxiliary layer 182 may be formed on the first electrode 160 exposed through the first opening 174a by dropping a first solution and then drying it. At least one side surface of the first charge auxiliary layer 182 may be surrounded by the second bank 174. When the first solution is dried, a drying speed of a solvent in a region adjacent to the second bank 174 may be different from that in other regions. Therefore, a height of the first charge auxiliary layer 182 in the region adjacent to the second bank 174 can rise as it gets closer to the second bank 174. The first charge auxiliary layer 182 may comprise a hole injecting layer (HIL) and/or a hole transporting layer (HTL).

Then, a light-emitting material layer 184 may be formed on the first charge auxiliary layer 182 by dropping a second solution and then drying it. At least one side surface of the light-emitting material layer 184 may be surrounded by the second bank 174. When the second solution is dried, a drying speed of a solvent in a region adjacent to the second bank 174 may be different from that in other regions. Therefore, a height of the light-emitting material layer 184 in the region adjacent to the second bank 174 can rise as it gets closer to the second bank 174.

Figure 5D:
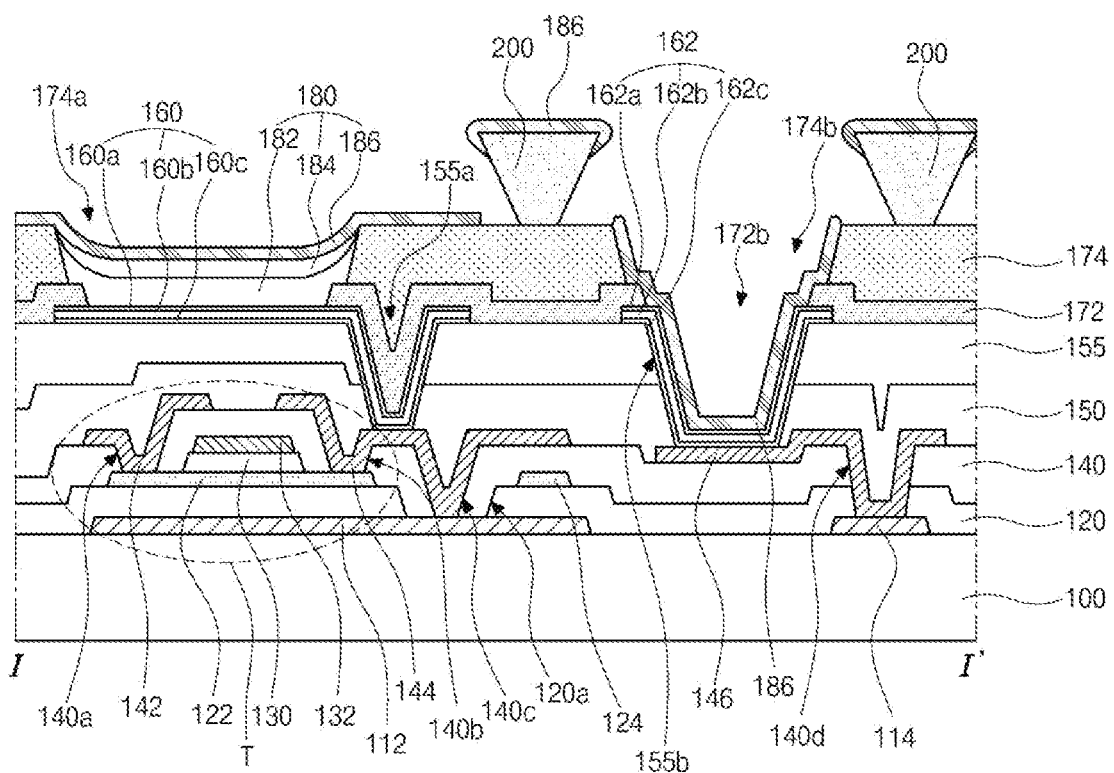

Next, in FIG. 5D, a second charge auxiliary layer 186 may be formed on the light-emitting material layer 184 by depositing an organic material and/or inorganic material. The second charge auxiliary layer 186 may be formed substantially over the entire surface of the substrate 100. Accordingly, the second charge auxiliary layer 186 may also be formed on the second bank 174, the connection pattern 162, and the auxiliary bank 200. In this case, the second charge auxiliary layer 186 may not be formed substantially on the side surface of the auxiliary bank 200 and the top surface of the second bank 174 adjacent to the auxiliary bank 200 due to the auxiliary bank 200 having the reversely inclined side surface, so that the top surface of the second bank 174 between the auxiliary bank 200 and the second auxiliary contact hole 174b can be exposed, and the second charge auxiliary layer 186 on the auxiliary bank 200 can be disconnected and separated from the second charge auxiliary layer 186 on the connection pattern 162. The second charge auxiliary layer 186 may comprise an electron injecting layer (EIL) and/or an electron transporting layer (ETL).

The first charge auxiliary layer 182, the light-emitting material layer 184, and the second charge auxiliary layer 186 may constitute a light-emitting layer 180.

Figure 5E:
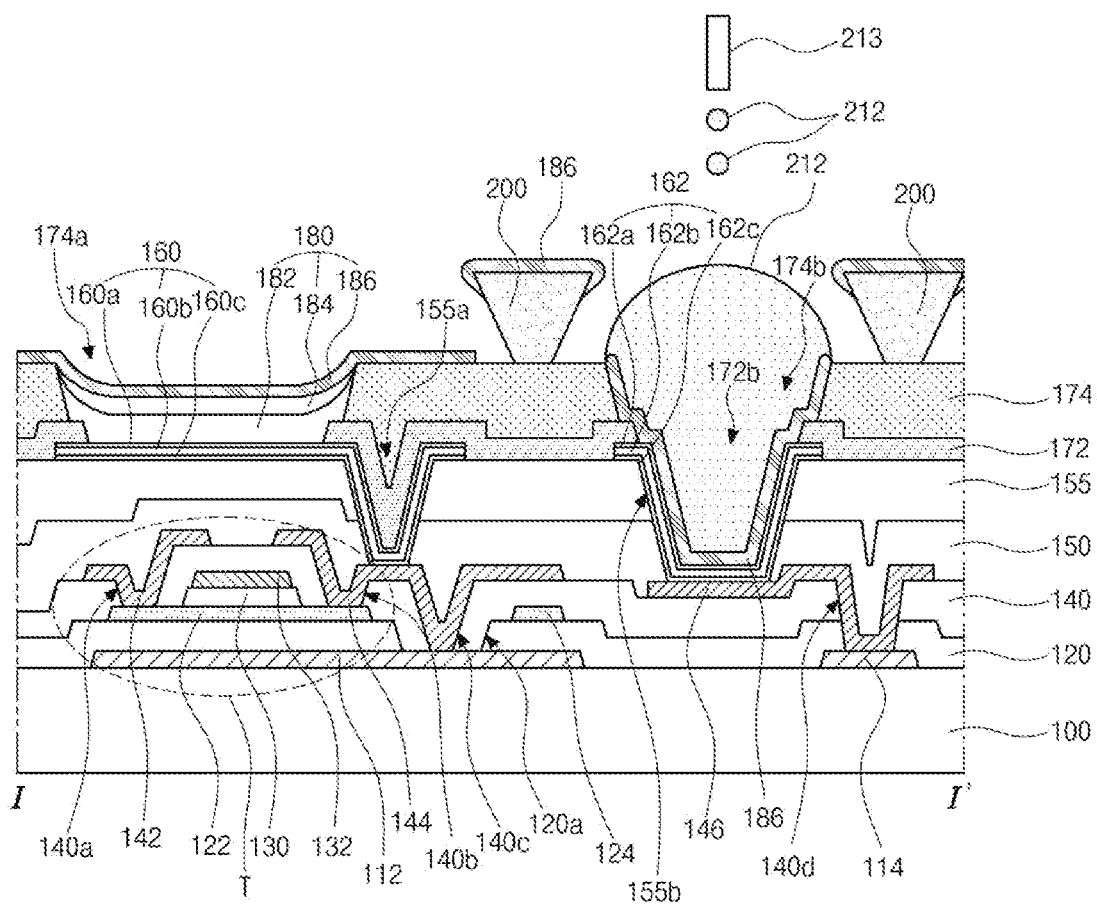

Next, in FIG. 5E, an organic solvent 212 may be applied into the first and second auxiliary contact holes 172b and 174b using injection apparatus 213. The organic solvent 212 may be used to dissolve the organic layer of the second charge auxiliary layer 186 and partially remove it. For example, the organic solvent 212 may include an ether or ester-based material containing a benzene ring.

Here, since the exposed top surface of the second bank 174 has the hydrophobic property, the applied organic solvent 212 may be disposed substantially only on the second charge auxiliary layer 186 in the first and second auxiliary contact hole 172b and 174b.

If there is no auxiliary bank 200, the top surface of the second bank 184 may be completely covered by the second charge auxiliary layer 186. The second charge auxiliary layer 186 may have a hydrophilic property, and thus the organic solvent 212 cannot be applied to be disposed only on the second charge auxiliary layer 186 in the first and second auxiliary contact hole 172b and 174b. That is, the organic solvent 212 may be applied onto regions other than the first and second auxiliary layers 172b and 174b, and the second charge auxiliary layer 186 cannot be partially removed. This may be even more problematic in a high resolution display device in which the areas of the first and second auxiliary contact holes 172b and 174b are relatively small.

Figure 5F:
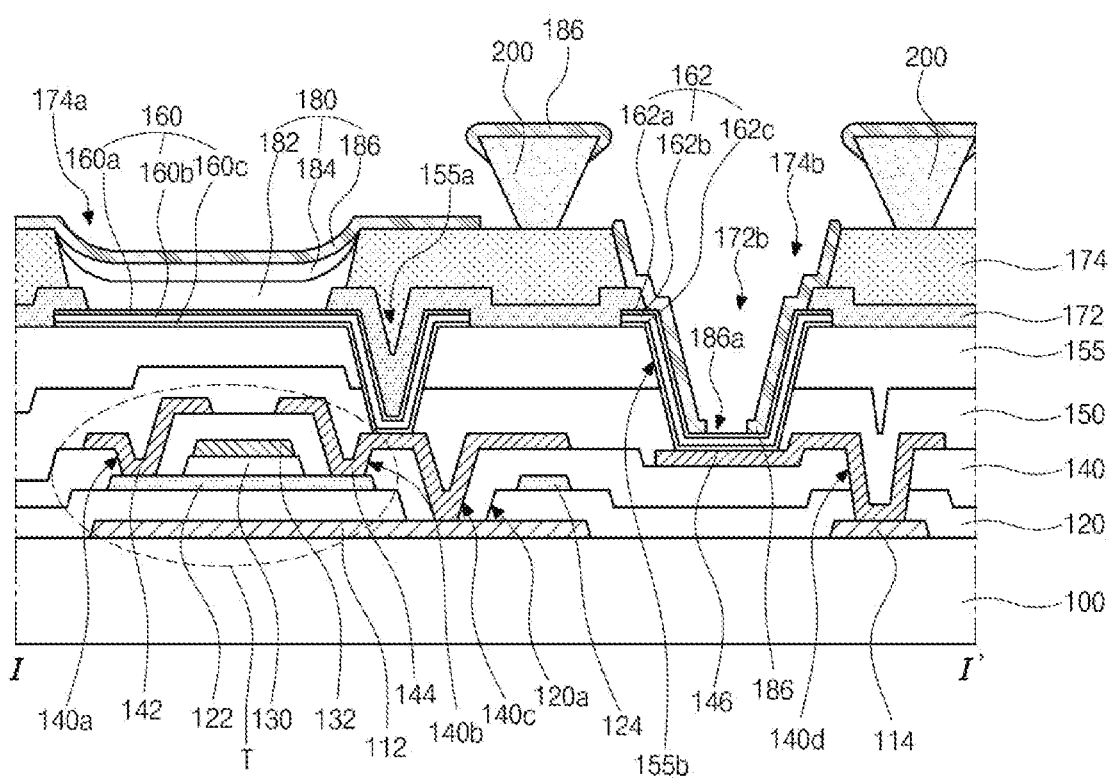

Next, in FIG. 5F, the second charge auxiliary layer 186 may be partially removed by drying the organic solvent 212 of FIG. 5E, thereby forming an opening 186a exposing the connection pattern 162.

In this case, the opening 186a may be formed substantially at the center of the first and second auxiliary contact holes 172a and 174b due to the coffee stain effect or coffee ring effect. The coffee stain effect or coffee ring effect is a phenomenon in which when a convex spherical liquid is dried, evaporation occurs at the edge more than at the center and solid is stacked on the edge. The material of the second charge auxiliary layer 186 dissolved in the organic solvent 212 of FIG. 5E may be stacked at the edges of the first and second auxiliary contact holes 172a and 174a due to the coffee stain effect or coffee ring effect and may not be stacked on the center of the first and second auxiliary contact holes 172a and 174a. Accordingly, the opening 186a can be formed substantially at the center of the first and second auxiliary contact holes 172a and 174a.

Figure 5G:
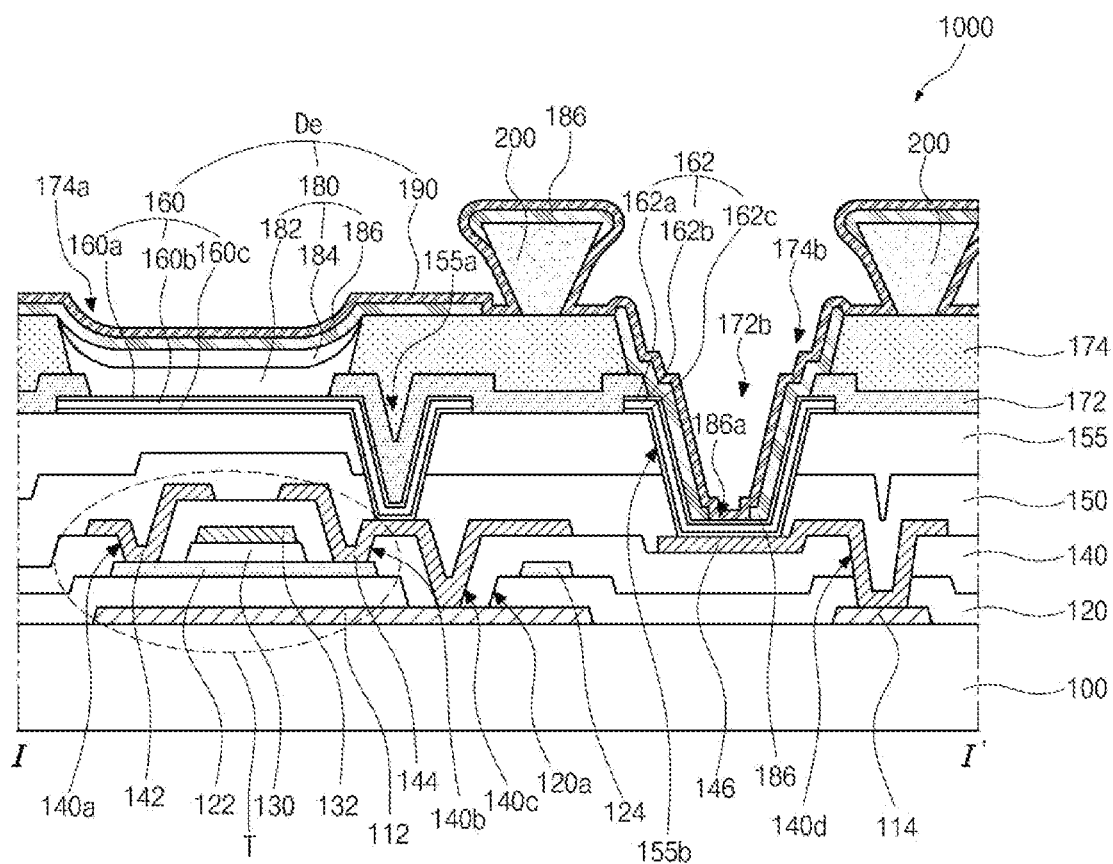

Next, in FIG. 5G, a second electrode 190 may be formed on the second charge auxiliary layer 186 having the opening 186a by depositing a conductive material, such as metal. The second electrode 190 may be formed substantially over the entire surface of the substrate 100. Accordingly, the second electrode 190 may also be formed on the auxiliary bank 200, and may also be formed on the side surface of the auxiliary bank 200.

Further, the second electrode 190 may also be formed on the connection pattern 162. The second electrode 190 may be electrically connected to the connection pattern 162 through the first and second auxiliary contact holes 172b and 174b. Here, since the connection pattern 162 may be exposed through the opening 186a of the second charge auxiliary layer 186, the second electrode 190 may be in direct contact with the connection pattern 162 through the opening 186a.

The first electrode 160, the light-emitting layer 180, and the second electrode 190 may constitute a light-emitting diode De. The first electrode 160 can serve as an anode, and the second electrode 190 can serve as a cathode.

As described above, in the electroluminescent display device 1000 according to the first embodiment of the present disclosure, the auxiliary bank 200 having the reversely inclined side surface may be formed on the second bank 174, and the top surface of the second bank 174 may be exposed. The second charge auxiliary layer 186 on the connection pattern 162 may be partially removed by the organic solvent 212, and the second electrode 190 may be in direct contact with the connection pattern 162. Accordingly, the electrical contact property between the second electrode 190 and the connection pattern 162 can be improved.

Although it has been described that the auxiliary bank 200 is applied to a double bank structure including the first and second banks 172 and 174 in the first embodiment of the present disclosure, the auxiliary bank 200 of the present disclosure may be applied to a single bank structure.

Second Embodiment

Figure 6:
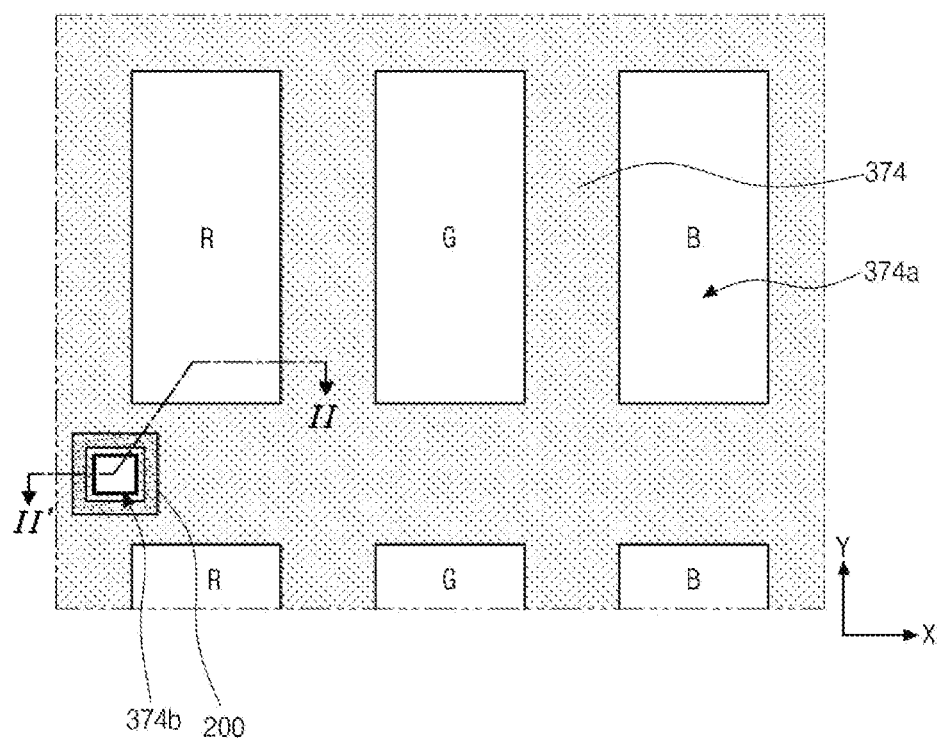
FIG. 6 is a schematic plan view of a pixel of an electroluminescent display device according to a second embodiment of the present disclosure.
Figure 7:
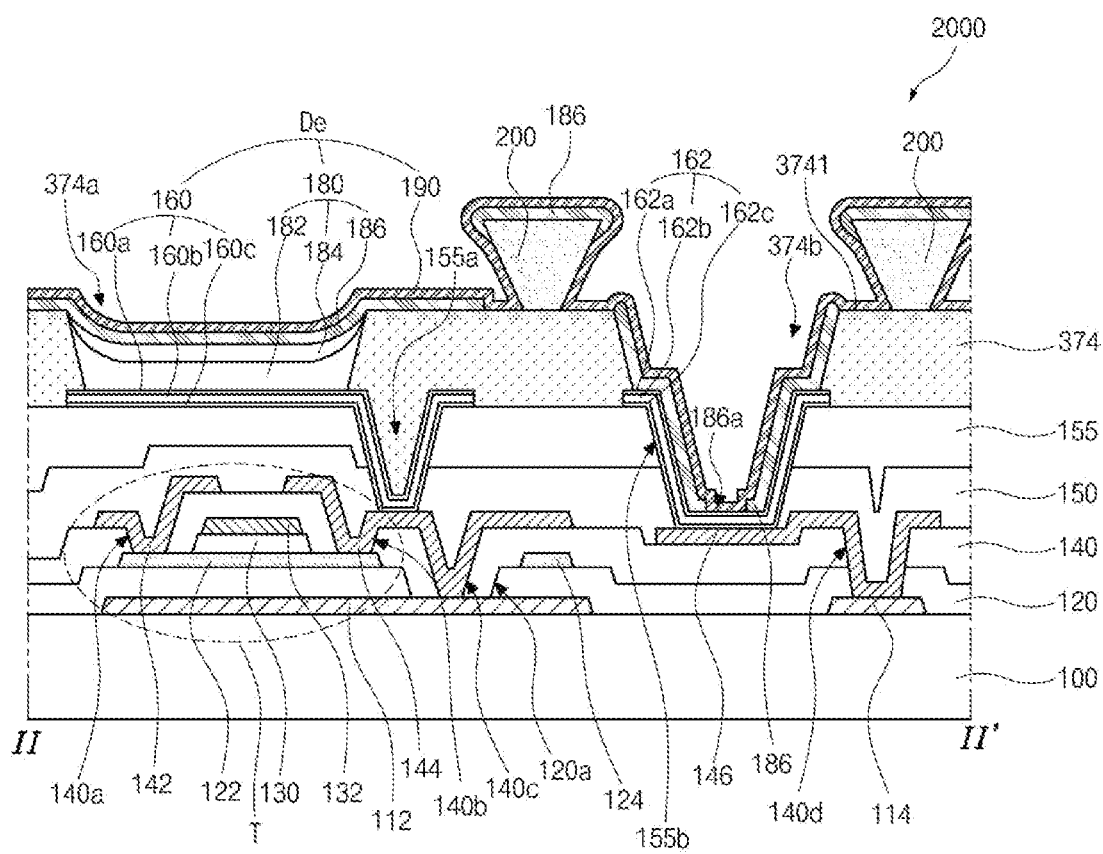
FIG. 7 is a schematic cross-sectional view of an electroluminescent display device according to the second embodiment of the present disclosure.

FIG. 6 is a schematic plan view of a pixel of an electroluminescent display device according to a second embodiment of the present disclosure, and FIG. 7 is a schematic cross-sectional view of an electroluminescent display device according to the second embodiment of the present disclosure. FIG. 6 primarily shows a bank configuration, and FIG. 7 shows a cross-section corresponding to line II-IP of FIG. 6. The electroluminescent display device according to the second embodiment of the present disclosure has substantially the same configuration as that of the first embodiment, except for the bank structure. The same parts as that of the first embodiment are designated by the same reference signs, and explanation for the same parts may be shortened or omitted.

As shown in the example of FIG. 6 and FIG. 7, in the electroluminescent display device 2000 according to the second embodiment of the present disclosure, a bank 374 may be disposed between adjacent different color sub-pixels R, G, and B along a first direction (e.g., X-axis direction) and between adjacent same color sub-pixels R, G, and B along a second direction (e.g., Y-axis direction). The bank 374 may have an opening 374a corresponding to each of red, green, and blue sub-pixels R, G, and B.

The bank 374 may cover edges of the first electrode 160, and may expose a central portion of the first electrode 160 through the opening 374a.

In addition, the bank 374 may cover edges of the connection pattern 162, and may have an auxiliary contact hole 374b exposing a central portion of the connection pattern 162. The auxiliary contact hole 374b may be formed between the adjacent red sub-pixels R along the second direction (e.g., Y-axis direction).

At least a top surface 3741 of the bank 374 may have a hydrophobic property, and a side surface of the bank 374 may have a hydrophilic property or a hydrophobic property. A thickness of the bank 374 may be 1 μm to 2 μm, but embodiments are not limited thereto.

The auxiliary bank 200 may be formed on the bank 374 corresponding to the auxiliary contact hole 374b. The auxiliary bank 200 may surround the auxiliary contact hole 374b and may expose the hydrophobic top surface 3741 of the bank 374. The auxiliary bank 200 may have a reversely inclined side surface.

In this case, it is desirable that the width of the top surface 3741 of the bank 374 exposed between the auxiliary bank 200 and the auxiliary contact hole 374b may be 5 μm to 8 μm, the thickness of the auxiliary bank 200 may be more than 1.5 μm and less than 2.0 μm, and the side surface of the auxiliary bank 200 may have a reverse inclination angle of more than 120 degrees and less than 150 degrees.

In embodiments of the present disclosure, by forming at least some of the light-emitting layer of each sub-pixel through the solution process, a mask may be omitted. As such, manufacturing costs may be reduced, and a display device with a large size and high definition can be implemented.

In addition, the light-emitting layers of the same color sub-pixels may be connected to each other and formed as one body, thereby reducing or minimizing the deviation in the dropping amount between nozzles, and uniformly forming the thicknesses of the light-emitting layers of respective sub-pixels. Therefore, a mura or nonuniformity may be reduced or prevented, thereby effectively ameliorating or preventing the image quality of the display device from being lowered.

Moreover, the second electrode may be connected to the auxiliary electrode through the connection pattern, thereby lowering the resistance of the second electrode.

Also, the auxiliary bank having the reversely inclined side surface may be formed on the bank, and the second electrode may be in direct contact with the connection pattern, thereby improving the electrical contact property between the second electrode and the connection pattern.

It will be apparent to those skilled in the art that various modifications and variations may be made in the present disclosure without departing from the technical idea or scope of the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electroluminescent display device, comprising:
   a substrate;
   a first electrode on the substrate;
   a connection pattern on the substrate, the connection pattern including a same material as the first electrode;
   a bank covering edges of the first electrode and the connection pattern;
   an auxiliary bank on the bank;
   a light-emitting layer on the first electrode; and
   a second electrode on the light-emitting layer, the bank, and the auxiliary bank,
   wherein the auxiliary bank has a reversely inclined side surface, and
   wherein the light-emitting layer includes a hole auxiliary layer, a light-emitting material layer, and an electron auxiliary layer, the electron auxiliary layer having an opening exposing the connection pattern, and the second electrode contacts the connection pattern through opening, and
   wherein the bank has a contact hole exposing the connection pattern, and the reversely inclined side surface of the auxiliary bank surrounds and does not overlap the contact hole.

2. The electroluminescent display device of claim 1, wherein the second electrode contacts the side surface of the auxiliary bank.

3. The electroluminescent display device of claim 1, wherein the side surface of the auxiliary bank has a reverse inclination angle of more than 120 degrees and less than 150 degrees.

4. The electroluminescent display device of claim 3, wherein the auxiliary bank has a thickness of more than 1.5 µm and less than 2.0 µm.

5. The electroluminescent display device of claim 1, wherein a top surface of the bank is exposed between the contact hole and the auxiliary bank.

6. The electroluminescent display device of claim 5, wherein the second electrode is in contact with the top surface of the bank exposed between the contact hole and the auxiliary bank.

7. The electroluminescent display device of claim 1, wherein at least one side surface of each of the hole auxiliary layer and the light-emitting material layer is surrounded by the bank, and
   wherein the electron auxiliary layer is disposed on the bank, the auxiliary bank, and the connection pattern, and
   wherein the electron auxiliary layer on the auxiliary bank is separated from the electron auxiliary layer on the bank and the electron auxiliary layer on the connection pattern.

8. The electroluminescent display device of claim 1, further comprising:
   at least one thin film transistor between the substrate and the first electrode,
   wherein the first electrode is connected to the at least one thin film transistor.

9. Electroluminescent display device of claim 1, wherein the bank includes a first bank having a hydrophilic property and a second bank having a hydrophobic property.

10. The electroluminescent display device of claim 9, wherein the first bank and the second bank are formed as one body.

11. The electroluminescent display device of claim 9, wherein light-emitting layers in adjacent pixel regions along one direction are connected to each other as one body.

12. The electroluminescent display device of claim 1, wherein the auxiliary bank surrounds the opening and does not overlap the opening.

13. A method of manufacturing an electroluminescent display device, comprising:
    forming a first electrode and a connection pattern on a substrate;
    forming a bank on the first electrode and the connection pattern;
    forming an auxiliary bank having a reversely inclined sidewall, the auxiliary bank being positioned on the bank;
    forming a light-emitting layer on the first electrode, including forming an electron auxiliary layer on the bank, the auxiliary bank, and the connection pattern;
    forming a second electrode on the light-emitting layer, the bank, and the auxiliary bank; and
    forming an opening exposing the connection pattern by removing a portion of the electron auxiliary layer between the step of forming the electron auxiliary layer and the step of forming the second electrode,
    wherein the step of forming the second electrode includes forming the second electrode in contact with the connection pattern through the opening.

14. The method of claim 13, wherein forming the light-emitting layer includes forming a hole auxiliary layer and forming a light-emitting material layer,
    wherein at least one side surface of each of the hole auxiliary layer and the light-emitting material layer is surrounded by the bank, and
    wherein the electron auxiliary layer is disposed on the bank, the auxiliary bank, and the connection pattern, and
    wherein the electron auxiliary layer on the auxiliary bank is separated from the electron auxiliary layer on the bank and the electron auxiliary layer on the connection pattern.

15. The method of claim 13, wherein the first electrode and the connection pattern are formed at the same time using the same process steps and are comprised of the same material.

16. The method of claim 13, wherein forming the light-emitting layer comprises:
    forming a light-emitting material layer; and
    forming the electron auxiliary layer above the light-emitting material layer,
    wherein the step of forming the second electrode includes forming the second electrode within the opening in contact with the connection pattern.

17. An electroluminescent display device, comprising:
    a first electrode disposed above a substrate, the first electrode including a first portion of a layer of material;
    a connection pattern disposed above the substrate, the connection pattern including a second portion of the layer of material;
    a bank being disposed between at least a portion of the first electrode and at least a portion of the connection pattern;
    an auxiliary bank disposed above the bank, the auxiliary bank having a reversely inclined side surface;
    a light-emitting material layer disposed above the first electrode; and
    a second electrode disposed above the light-emitting material layer, the bank, and the auxiliary bank,
    wherein the bank has a contact hole exposing the connection pattern, and the reversely inclined side surface of the auxiliary bank surrounds and does not overlap the contact hole.

18. The electroluminescent display device of claim 17, wherein:
    the auxiliary bank includes an insulating material structure with a reverse tapered profile;
    the layer of material comprises a layer of conductive material; and
    the bank being disposed between the first portion of the layer of material and the second portion of the layer of material.

19. The electroluminescent display device of claim 18, wherein:
    the layer of conductive material comprises indium tin oxide.

20. The electroluminescent display device of claim 17, further comprising:
    a charge auxiliary layer disposed above the light-emitting material layer and in contact with the light emitting material layer in a pixel region and disposed above the connection pattern and in contact with the connection pattern in a contact region; and
    an opening in the charge auxiliary layer in the contact region, the second electrode being directly connected to the connection pattern in the contact region.

21. The electroluminescent display device of claim 20, wherein:
    the charge auxiliary layer includes one of an electron injecting layer or an electron transporting layer.

22. The electroluminescent display device of claim 17, further comprising:
    a charge auxiliary layer positioned between the light-emitting material layer and the second electrode.

23. The electroluminescent display device of claim 22, wherein:
    the second electrode contacts the connection pattern through an opening in the charge auxiliary layer.

24. The electroluminescent display device of claim 17, wherein a portion of the auxiliary bank is disposed between the first electrode and the connection pattern and is spaced from the first electrode and the connection pattern.

* * * * *